(12) United States Patent
Yang et al.

(10) Patent No.: US 11,916,145 B2
(45) Date of Patent: Feb. 27, 2024

(54) INDEPENDENT CONTROL OF STACKED SEMICONDUCTOR DEVICE

(71) Applicant: Taiwan Semiconductor Manufacturing Co., Ltd., Hsinchu (TW)

(72) Inventors: Chansyun David Yang, Shinchu (TW); Keh-Jeng Chang, Hsinchu (TW); Chan-Lon Yang, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 30 days.

(21) Appl. No.: 17/815,396

(22) Filed: Jul. 27, 2022

(65) Prior Publication Data

US 2022/0367702 A1    Nov. 17, 2022

Related U.S. Application Data

(62) Division of application No. 16/885,850, filed on May 28, 2020, now Pat. No. 11,502,199.

(51) Int. Cl.
| | | |
|---|---|---|
| *H01L 29/78* | (2006.01) | |
| *H01L 21/8234* | (2006.01) | |
| *H01L 29/66* | (2006.01) | |

(52) U.S. Cl.
CPC .... *H01L 29/785* (2013.01); *H01L 21/823431* (2013.01); *H01L 29/66795* (2013.01); *H01L 2029/7858* (2013.01)

(58) Field of Classification Search
CPC .......... H01L 29/785; H01L 21/823431; H01L 29/66795; H01L 2029/7858
USPC ........................................................ 257/401
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2019/0165146 A1 | 5/2019 | Ho et al. |
| 2020/0235092 A1 | 7/2020 | Lilak et al. |
| 2020/0273755 A1 | 8/2020 | Wu et al. |
| 2020/0328127 A1 | 10/2020 | Yamashita et al. |
| 2020/0343241 A1 | 10/2020 | Wu et al. |
| 2020/0365464 A1 | 11/2020 | Sreenivasan et al. |
| 2020/0411388 A1 | 12/2020 | Wu et al. |

(Continued)

FOREIGN PATENT DOCUMENTS

KR    20160102972 A  *  8/2016

*Primary Examiner* — Mohammad M Hoque
(74) *Attorney, Agent, or Firm* — Sterne, Kessler, Goldstein & Fox P.L.L.C.

(57) ABSTRACT

The present disclosure describes a semiconductor device includes a first fin structure, an isolation structure in contact with a top surface of the first fin structure, a substrate layer in contact with the isolation structure, an epitaxial layer in contact with the isolation structure and the substrate layer, and a second fin structure above the first fin structure and in contact with the epitaxial layer.

20 Claims, 13 Drawing Sheets

(56) References Cited

U.S. PATENT DOCUMENTS

2021/0376137 A1 12/2021 Yang et al.
2022/0102492 A1 3/2022 Gardner et al.

\* cited by examiner

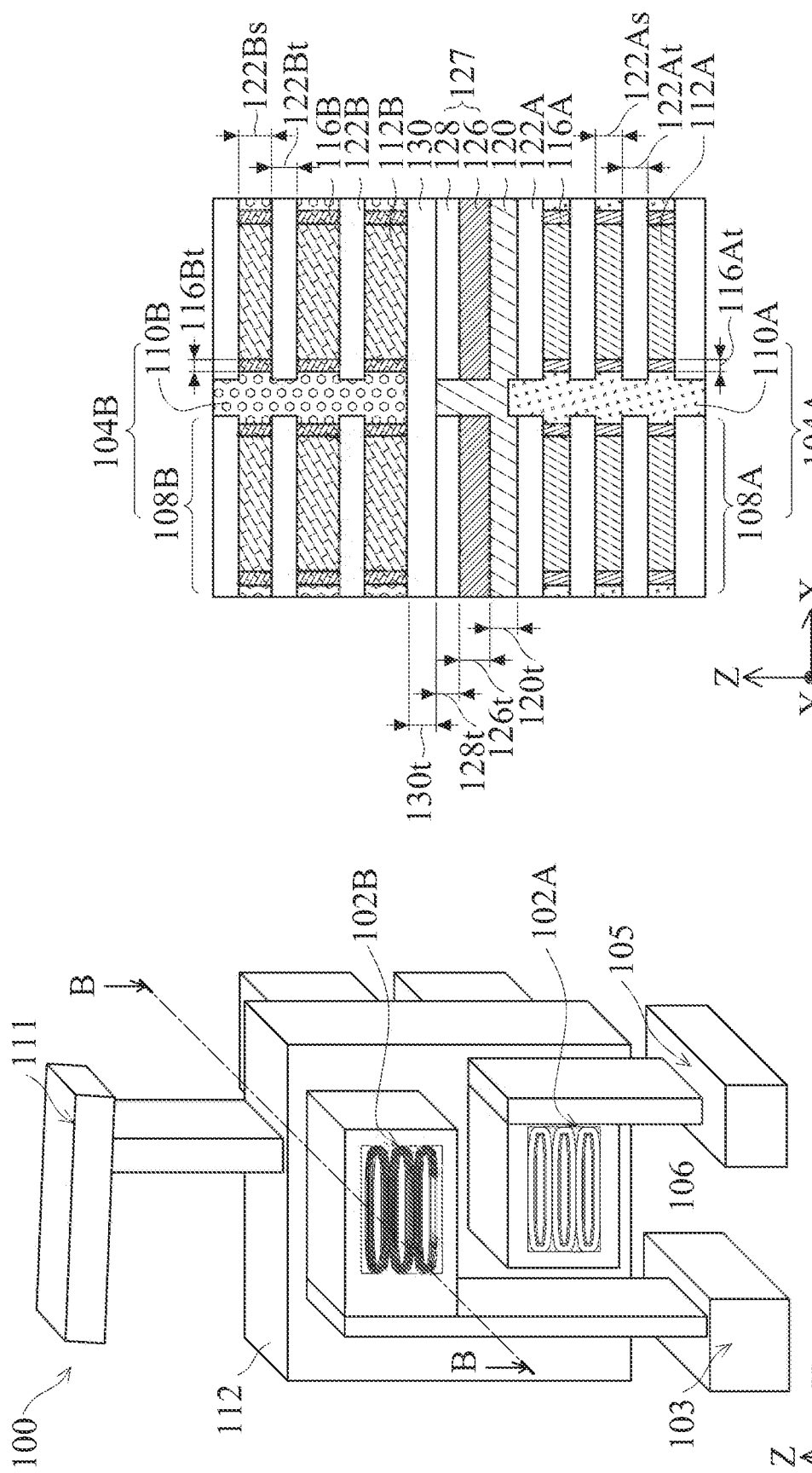

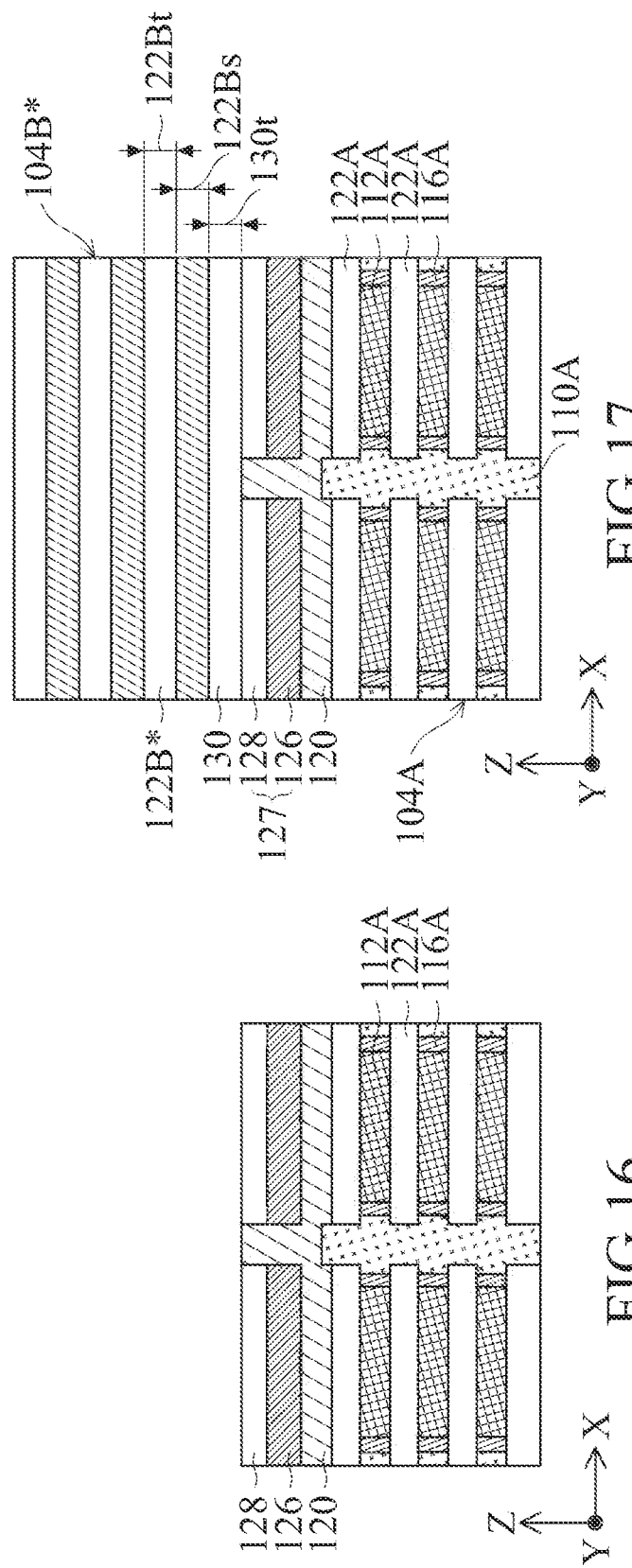

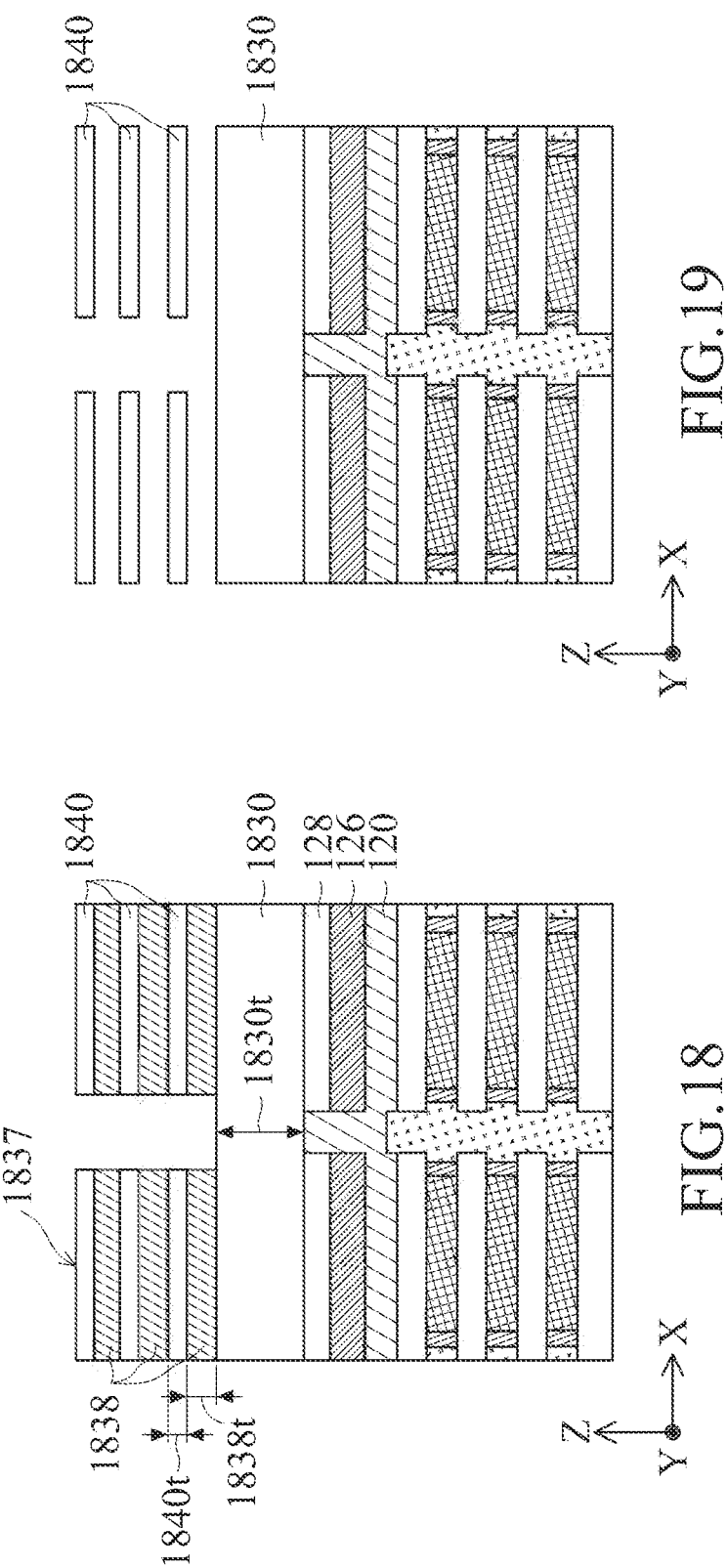

INDEPENDENT CONTROL OF STACKED SEMICONDUCTOR DEVICE

CROSS-REFERENCE TO RELATED APPLICATION

This application is a divisional of U.S. Non-Provisional patent application Ser. No. 16/885,850, filed on May 28, 2020, titled "Independent Control of Stacked Semiconductor Device," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 1A and 1B illustrate an isometric view and a partial cross-sectional view of a vertically stacked semiconductor device, respectively, in accordance with some embodiments.

FIGS. 4-17 illustrate partial cross-sectional views of a vertically stacked semiconductor device at various stages of its fabrication process, in accordance with some embodiments.

FIGS. 18-23 illustrate partial cross-sectional views of a vertically stacked semiconductor device with additional isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 2B:
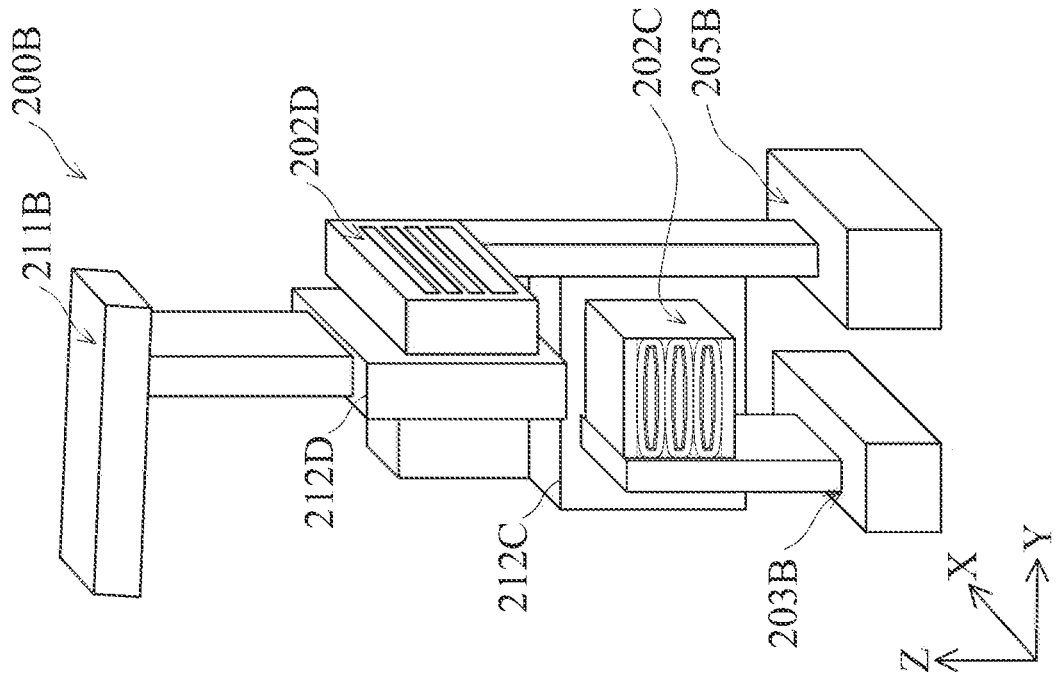
FIGS. 2A and 2B illustrate isometric views of a crossover-stacked semiconductor device with a vertical gate and a crossover-stacked semiconductor device with a rotated gate, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, indium phosphide, etc. Alternatively, the substrate may be made from an electrically non-conductive material, such as glass and sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "low-k" refers to a small dielectric constant. In the field of semiconductor device structures and manufacturing processes, low-k refers to a dielectric constant that is less than the dielectric constant of SiO$_2$ (e.g., less than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "vertical," means nominally along a direction perpendicular to the surface of a substrate.

As used herein, the term "crossover," means structures along directions crossing at a point.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of a target value (e.g., ±1%, ±2%, +3%, ±4%, +5% of the target value).

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

With advances in semiconductor technology, multi-gate devices have been introduced in an effort to improve gate control by increasing gate-channel coupling, reduce off-state current, and reduce short-channel effects (SCEs). One such multi-gate device that has been introduced is the gate-all-around fin field effect transistor (GAA finFET). The GAA finFET provides a channel in a stacked nanosheet/nanowire configuration. The GAA finFET derives its name from the gate structure that can extend around the channel and provide gate control of the channel on two or four sides of the channel. GAA finFETs are compatible with MOSFET manufacturing processes and their structure allows them to be scaled while maintaining gate control and mitigating SCEs.

GAA finFETs can be planar GAA finFETs with n-type and p-type GAA finFETs in a same plane and fabricated from the same stack of nanosheets/nanowires. With increasing demand for lower power consumption, high performance, and small area (collectively referred to as "PPA") of semiconductor devices, planar GAA finFETs can have their challenges. For example, n-type and p-type planar GAA finFETs have the same nanosheet/nanowire dimensions and spacings between the stacked nanosheets/nanowires, thus having the same space for n-type and p-type work function metal fill. N-type and p-type GAA finFETs may need different spaces to provide flexibility in the n-type and p-type work function metal fill. In addition, n-type and p-type planar GAA finFETs have inner spacer materials with the same dielectric constant (also referred to as "k value"). N-type and p-type GAA finFETs may need different inner spacer materials for different device performance requirements. In addition, the nanosheet/nanowire mixed threshold voltage boundary can shift during an etch process of planar GAA finFETs. The nanosheet/nanowire mixed threshold voltage boundary shift may degrade device performance of planar GAA finFETs. Further, planar GAA finFETs have the same nanosheet/nanowire dimensions and spacings between the stacked nanosheets/nanowires, but multiple threshold voltages require different thicknesses of work function metal. Therefore, incorporating multiple threshold voltages in planar GAA finFETs through work function metal nanosheet/nanowire patterning can be challenging.

Various embodiments in accordance with the present disclosure provide methods for forming a stacked semiconductor device. According to some embodiments, the stacked semiconductor device can include a top fin structure along a direction vertically stacked on top of a bottom fin structure along the same direction (referred to as "vertically stacked"). In some embodiments, the vertically stacked top and bottom fin structures can each independently control their nanosheet/nanowire dimensions and spacings. In some embodiments, the top fin structure oriented along a first direction can be stacked on top of a bottom fin structure oriented along a second direction, where the first and second directions are oriented about 90 degrees relative to one another. This is also referred to herein "crossover-stacked." In some embodiments, a crossover-stacked semiconductor device can provide compact metal interconnect place and route for the top and bottom fin structures, therefore improving PPA performance. In some embodiments, a crossover-stacked semiconductor device can include a top gate structure rotated by some degrees relative to the bottom gate structure, such as about 90 degrees (referred to as "rotated gate"). In some embodiments, a crossover-stacked semiconductor device with a rotated gate can provide further compact metal interconnect route and place to reduce parasitic resistance and capacitance, thus improving PPA performance. In some embodiments, an isolation layer can isolate the top fin structure and the bottom fin structure. In some embodiments, additional isolation layers between the top fin structure and the bottom fin structure can improve the isolation.

FIG. 1A illustrates an isometric view of a vertically stacked semiconductor device 100 having a GAA finFET 1029 vertically stacked on top of a GAA finFET 102A, according to some embodiments. FIG. 1B illustrates a partial cross-sectional view along line B-B of vertically stacked semiconductor device 100, according to some embodiments. In some embodiments, FIGS. 1A and 1B show a portion of an IC layout where the spacing between the fin structures (e.g., the fin pitch), the dimensions of the fin structures, and the dimensions of the gate structures can be similar or different from the ones shown in FIGS. 1A and 1B. Additionally, the isometric and cross-sectional views of semiconductor device 100 in FIGS. 1A and 1B and the subsequent figures are for illustrative purposes. FIGS. 1A and 1B and the subsequent figures may not reflect the actual geometry of the actual structures, features, or films.

Referring to FIGS. 1A and 1B, vertically stacked semiconductor device 100 can include GAA finFETs 102A and 102B, source/drain interconnects 103 and 105 connected to GAA finFETs 102A and 102B, a gate structure 112, and a gate interconnect 113 connected to gate structure 112. GAA finFETs 102A and 102B can further include fin structures 104A and 104B, gate structures 112A and 112B, inner spacer structures 116A and 116B, an isolation structure 120, a doping layer 126, and a semiconductor layer 128.

In some embodiments, GAA finFETs 102A and 102B can be both p-type finFETs (PFETs), both n-type finFETs (NFETS), or one of each conductivity type finFET. In some embodiments, GAA finFETs 102A can be p-type (also referred to as "PFET 102A") and GAA finFETs 102B can be n-type (also referred to as "NFET 1029"). Though FIGS. 1A and 1B show two GAA finFETs, vertically stacked semiconductor device 100 can have any number of GAA finFETs. Also, though FIGS. 1A and 1B show one gate structure 112, vertically stacked semiconductor device 100 can have additional gate structures similar and parallel to gate structure 112. In addition, semiconductor device 100 can be incorporated into an integrated circuit through the use of other structural components, such as contacts, conductive vias, conductive lines, dielectric layers, passivation layers, etc., that are not shown for simplicity. The discussion of elements of GAA finFETs 104A and 104B with the same annotations applies to each other, unless mentioned otherwise.

As shown in FIG. 1A, GAA finFET 102A can be formed on a substrate 106. Substrate 106 can be a semiconductor material, such as silicon (Si). In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

As shown in FIGS. 1A and 1B, GAA finFET 102B can be formed on epitaxial layer 130, semiconductor layer 128, and doping layer 126. In some embodiments, semiconductor layer 128 and doping layer 126 can serve as a substrate layer 127 for GAA finFET 102B. Doping layer 126 can be disposed on GAA finFET 102A and include semiconductor materials similar to or different from substrate 106. In some embodiments, doping layer 126 can include Si. In some embodiments, the semiconductor materials of doping layer 126 can be in-situ doped during its epitaxial growth process using: (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and other p-type doping precursors, can be used. For n-type in-situ doping, n-type doping precursors, such as phosphine ($PH_3$), arsine ($AsH_3$), and other n-type doping precursors, can be used. Doping layer 126 can have a vertical dimension 126$t$ (e.g., thicknesses) along a Z-axis ranging from about 5 nm to about 10 nm. In some embodiments, doping layer 126 can be doped with a different conductivity type from substrate 106, such as n-type for substrate 106 and p-type for doping layer 126. In embodiments, doping layer 126 can serve as an implant well for GAA finFETs 102B. Other dimensions, materials, and doping type for doping layer 126 are within the scope and spirit of this disclosure.

Semiconductor layer 128 can be disposed on doping layer 126 and include semiconductor materials similar to or different from doping layer 126. In some embodiments, semiconductor layer 128 can include Si. The semiconductor materials of semiconductor layers 122 can be undoped or can be in-situ doped using a similar epitaxial growth process as doping layer 126. Semiconductor layer 128 can have a thickness 128$t$ along a Z-axis ranging from about 12 nm to about 20 nm. In some embodiments, semiconductor layer 128 can help subsequent growth of epitaxial layer 130 and fin structure 104B.

Epitaxial layer 130 can be disposed on semiconductor layer 128 and isolation structure 120. In some embodiments, epitaxial layer 130 can be epitaxially grown similar to semiconductor layer 128. In some embodiments, epitaxial layer 130 can include Si without any substantial amount of Ge. In some embodiments, epitaxial layer 130 can be epitaxially grown on semiconductor layer 128 and merge over the portion of isolation structure 120 on epitaxial fin regions 110A. In some embodiments, epitaxial layer 130 can have a thickness 130$t$ along a Z-axis ranging from about 10 nm to about 20 nm.

Semiconductor device 100 can further include fin structures 104A and 104B extending along an X-axis and through GAA finFETs 102A and 102B, respectively. In some embodiments, fin structures 104A and 104B can each include stacked fin portions 108A and 108B and epitaxial fin regions 110A and 110B. Each of stacked fin portions 108A and 108B can include a stack of semiconductor layers 122A and 122B, which can be in the form of nanosheets or nanowires. Each of semiconductor layers 122A and 122B can form a channel region underlying gate structures 112A and 112B of GAA finFETs 102A and 102B, respectively.

In some embodiments, semiconductor layers 122A and 122B can include semiconductor materials similar to or different from substrate 106. In some embodiments, each of semiconductor layers 122A and 122B can include silicon germanium (SiGe) with Ge in a range from about 5 atomic percent to about 50 atomic percent with any remaining atomic percent being Si or can include Si without any substantial amount of Ge. The semiconductor materials of semiconductor layers 122A and 112B can be undoped or can be in-situ doped using a similar epitaxial growth process as doping layer 126. Semiconductor layers 122A and 112B can have respective thicknesses 122A$t$ and 112B$t$ along a Z-axis, each ranging from about 5 nm to about 12 nm. Semiconductor layers 122A and 112B can also have respective spacings 122A$s$ and 112B$s$ along a Z-axis between each other, each ranging from about 6 nm to about 16 nm. Other dimensions and materials for semiconductor layers 122A and 122B are within the scope and spirit of this disclosure. Though three layers of semiconductor layers 122A and 112B for each of GAA finFETs 102A and 102B are shown in FIGS. 1A and 1B, GAA finFETs 102A and 102B can each have any number of semiconductor layers 122A and 122B.

Referring to FIGS. 1A and 1B, epitaxial fin regions 110A and 110B can be disposed adjacent to stack fin portions 108A and 108B, respectively. In some embodiments, epitaxial fin regions 110A and 110B can have any geometric shape, such as a polygon, an ellipsis, and a circle. Epitaxial fin regions 110A and 110B can include an epitaxially-grown semiconductor material. In some embodiments, the epitaxially grown semiconductor material is the same material as substrate 106. In some embodiments, the epitaxially-grown semiconductor material includes a different material from substrate 106. In some embodiments, the epitaxially-grown semiconductor material for epitaxial fin regions 110A and 110B can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, epitaxial fin regions 110A can be p-type for PFET 102A (also referred to as "p-type epitaxial fin regions 110A") and epitaxial fin regions 110B can be n-type for NFET 102B (also referred to as "n-type epitaxial fin regions 110B"). In some embodiments, p-type epitaxial fin regions 110A can include SiGe and can be in-situ doped during an epitaxial growth process using p-type dopants, such as boron, indium, and gallium. In some embodiments, p-type epitaxial fin regions 110A can have multiple sub-regions that can include SiGe and can differ from each other based on, for example, doping concentration, epitaxial growth process conditions, and/or relative concentration of Ge with respect to Si.

In some embodiments, n-type epitaxial fin regions 110B can include Si and can be in-situ doped during an epitaxial growth process using n-type dopants, such as phosphorus and arsenic. In some embodiments, n-type epitaxial fin regions 110B can have multiple n-type epitaxial fin sub-regions that can differ from each other based on, for example, doping concentration and/or epitaxial growth process conditions.

Referring to FIGS. 1A and 1B, stacked fin structures 104A and 104B can be current-carrying structures for respective GAA finFETs 102A and 102B. Channel regions of GAA finFETs 102A and 102B can be formed in portions of their respective stacked fin structures 104A and 104B underlying gate structures 112A and 112B. Epitaxial fin regions 110A and 110B can function as source/drain (S/D) regions of respective GAA finFETs 102A and 102B.

According to some embodiments, fin structures 104B can be stacked on top of fin structures 104A and isolated by isolation structure 120, as shown in FIGS. 1A and 1B. In some embodiments, stacked fin structures 104A and 104B can provide independent control of dimensions and spacings of semiconductor layers 122A and 122B respectively. In some embodiments, the width and thickness of the semiconductor layers can be controlled to balance between power consumption and performance. For example, semiconductor layers 122A can increase the width along a Y-axis (not shown) and thickness 122At to improve performance of GAA finfets 102A. Semiconductor layers 122B can decrease the width along another Y-axis (not shown) and thickness 122Bt to reduce power and area consumption of GAA finfets 102B. In some embodiments, the thickness of and the spacing between the semiconductor layers can be controlled to balance conduction area and parasitic capacitance. In another example, semiconductor layers 122A can increase thickness 122At and spacing 122As to increase a conduction area of GAA finfets 102A. Semiconductor layers 122B can decrease thickness 122Bt and spacing 122Bs to reduce parasitic capacitance of GAA finfets 102B. In addition, semiconductor layers 122B can have a different spacing from semiconductor layers 122A for a different conductivity type work function metal fill.

Referring to FIGS. 1A and 1B, isolation structure 120 can be disposed between fin structures 104A and 104B. According to some embodiments, isolation structure 120 can isolate GAA finFETs 102A and 102B. According to some embodiments, isolation structure 120 can include insulating materials, such as silicon oxide, silicon nitride, a low-k material, other suitable insulating materials, and a combination thereof. In some embodiments, isolation structure 120 can include a first portion on stacked fin portions 108A and a second portion on epitaxial fin regions 110A. In some embodiments, isolation structure 120 can have a vertical dimension (e.g., thickness) 120t along a Z-axis ranging from about 5 nm to about 10 nm.

Referring to FIGS. 1A and 1B, gate structures 112A and 112B can be multi-layered structures and can be wrapped around stacked fin portions 108A and 108B. In some embodiments, each of semiconductor layers 122A and 122B of stacked fin portions 108A and 108B can be wrapped around by one of gate structures 112A and 112B or one or more layers of one of gate structures 112A and 112B respectively, for which gate structures 112A and 112B can be referred to as "gate-all-around (GAA) structures" or "horizontal gate-all-around structures" and GAA finFETs 102A and 102B can be referred to as "GAA FETs" or "GAA finFETs."

In some embodiments, gate structures 112A and 112B can include single layer or a stack of layers of gate electrode wrapping around semiconductor layers 122A and 122B respectively. In some embodiments, PFET 102A can include p-type work function materials for gate electrode of gate structure 112A. In some embodiments, NFET 102B can include n-type work function materials for gate electrode of gate structure 112B. In some embodiments, gate electrode of gate structures 112A and 112B can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, or combinations thereof.

Referring to FIGS. 1A and 1B, inner spacer structures 116A and 116B can be disposed between epitaxial fin regions 110A and 110B and portions of gate structures 112A and 112B, according to some embodiments. Inner spacer structures 116A and 116B can include a dielectric material, such as SiOC, SiGN, SiOCN, SiN, silicon oxide ($SiO_x$), silicon oxynitride ($SiO_yN$), and a combination thereof. In some embodiments, inner spacer structures 116A and 116B can include a single layer or multiple layers of insulating materials. In some embodiments, inner spacer structures 116A and 116B can isolate gate structures 112A and 112B and epitaxial fin regions 110A and 110B. In some embodiments, inner spacer structures 116A and 116B can have a thickness 116At and 116Bt along an X-axis ranging from about 3 nm to about 7 nm.

Referring to FIGS. 1A and 1B, gate interconnect 113 can be connected to a gate power supply line, and S/D interconnects 103 and 105 can be connected to S/D power supply lines. In some embodiments, gate interconnect 113 can be connected to a gate power supply line above GAA finFETs 102A and 102B and provide gate control to GAA finFETs 102A and 102B. In some embodiments, S/D interconnects 103 and 105 can be connected to S/D power supply lines buried in substrate 106. Buried power supply lines can reduce standard cell routing and memory cell routing. For example, the drain side of GAA finFET 102A can be connected to a buried Vdd power supply line, and the source side of GAA finFET 102B can be connected to a buried Vss power supply line.

In some embodiments, semiconductor device 100 can further include STI regions, gate dielectric layers, interlayer dielectric (ILD) layers, etch stop layer (ESL), S/D and gate contact structures, and other suitable layers and structures, which are not shown for simplicity.

Figure 2A:
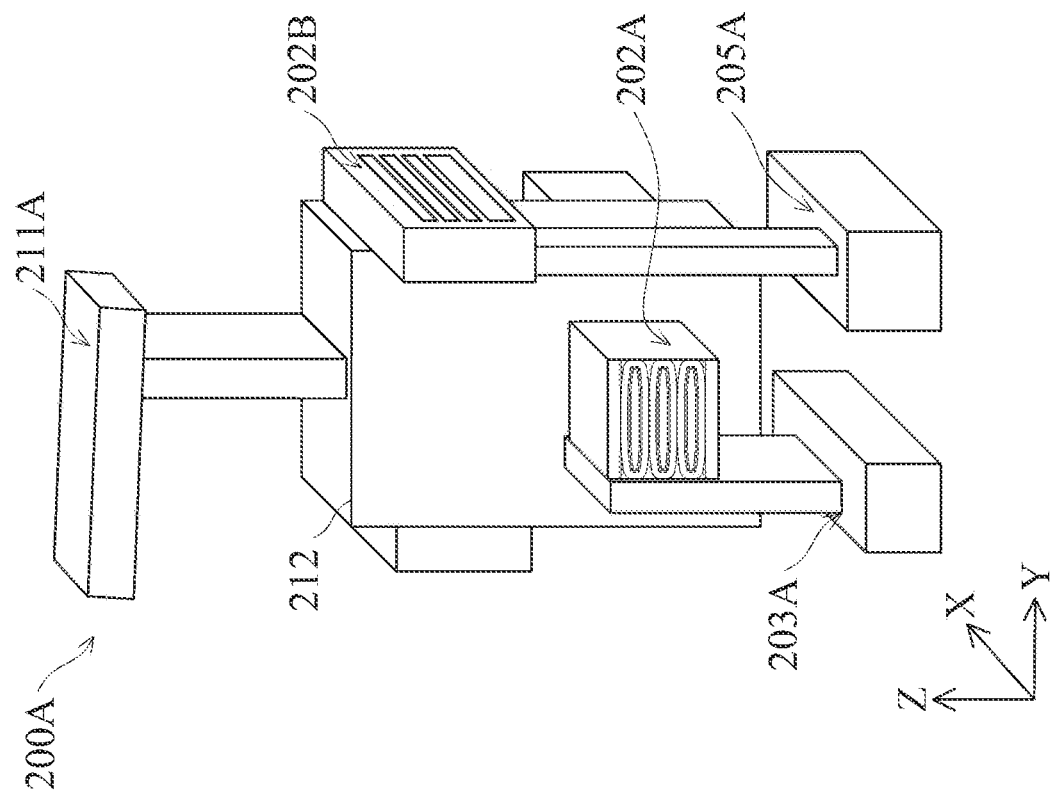

FIG. 2A illustrates an isometric view of a crossover-stacked semiconductor device 200A with a vertical gate, according to some embodiments. As shown in FIG. 2A, the fin structure of GAA finFET 202B can extend along a direction different from the fin structure of GAA finFET 202A, which can be referred to as crossover-stacked semiconductor device 200A. In some embodiments, the direction of the fin structure of GAA finFET 202B can rotate about 90 degrees from the direction of the fin structure of GAA finFET 202A. For example, as shown in FIG. 2A, the fin structure of GAA finFET 202B can extend along an X-axis, and the fin structure of GAA finFET 202A can extend along a Y-axis. According to some embodiments, compared with vertically stacked semiconductor device 100, crossover-stacked semiconductor device 200A can provide more simplicity in lithography and more compact metal interconnect to reduce parasitic resistance and capacitance, as well as more flexible place and route and improved placement legalization, in addition to independent control of fin structures dimensions and spacings.

FIG. 2B illustrates an isometric view of a crossover-stacked semiconductor device 200B with a rotated gate, according to some embodiments. As shown in FIG. 2B, the fin structure and the gate structure of GAA finFET 202D can extend along different directions from the fin structure and the gate structure of GAA finFET 202C, respectively. In some embodiments, the direction of the fin structure of GAA finFET 202D can rotate about 90 degrees from the direction of the fin structure of GAA finFET 202C, and the direction of gate structure 212D of GAA finFET 202D can rotate about 90 degrees from the direction of gate structure 212C of GAA finFET 202C. For example, as shown in FIG. 2B, the fin structure of GAA finFET 202C can extend along an X-axis, and gate structure 212C can extend along a Y-axis. The fin structure of GAA finFET 202D can extend along a Y-axis, and gate structure 212D can extend along an X-axis. In some embodiments, compared with crossover-stacked semiconductor device 200A, crossover-stacked semiconductor device 200B with a rotated gate can provide further compact metal interconnect to reduce parasitic resistance and capacitance by providing a shorter routing path, thus improving PPA performance. In some embodiments, compared with other planar GAA finFETs, crossover-stacked semiconductor device with a rotated gate can reduce the device area by about 30% to about 50%. In some embodiments, compared with other planar GAA finFETs, crossover-stacked semiconductor device 200B can reduce the device area by about 30% to about 50%.

Figure 3:
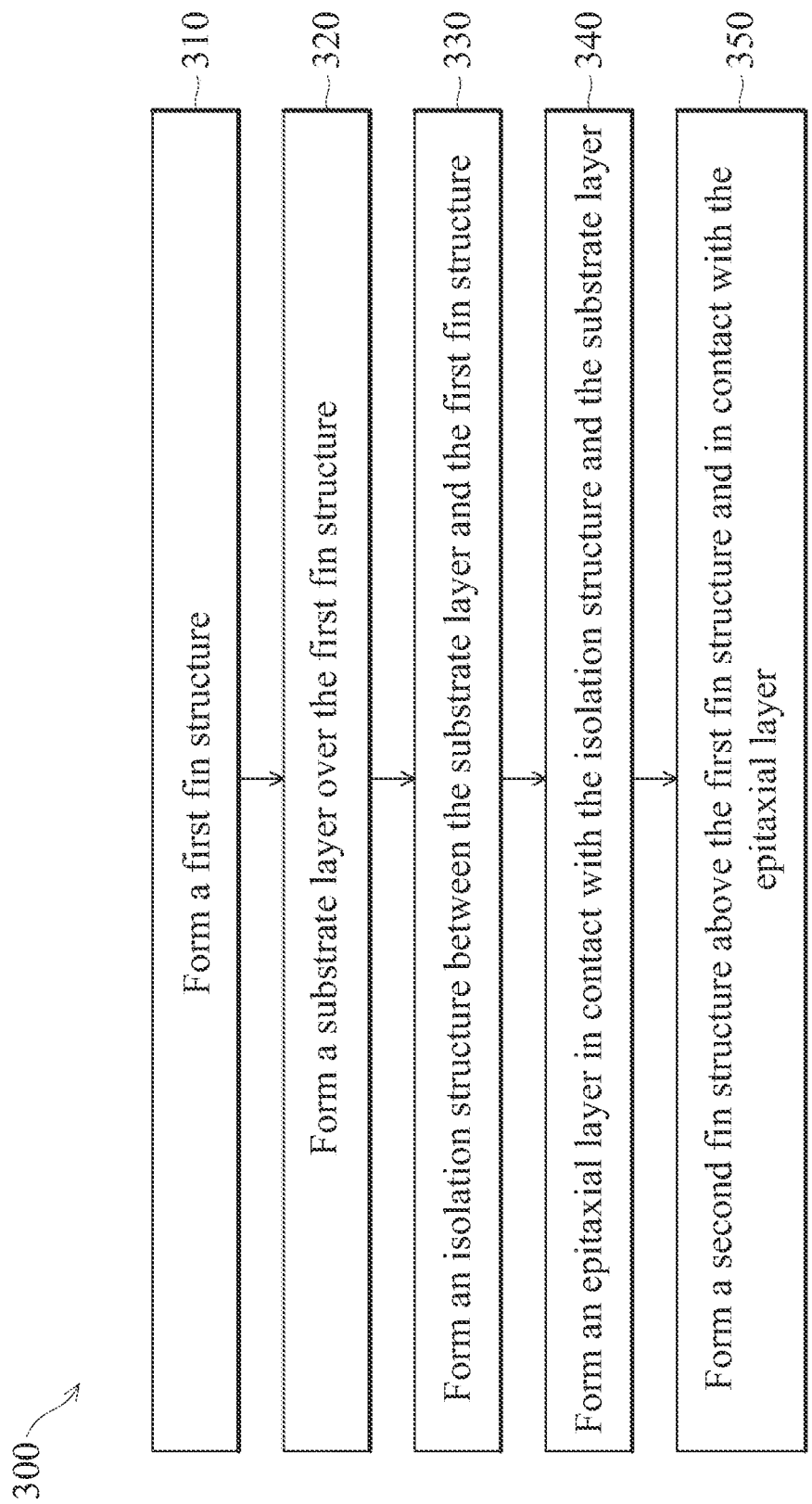
FIG. 3 is a flow diagram of a method for fabricating a stacked semiconductor device, in accordance with some embodiments.

FIG. 3 is a flow diagram of a method 300 for fabricating a stacked semiconductor device, such as semiconductor devices 100, 200A, and 200B, according to some embodiments. Additional fabrication operations may be performed between various operations of method 300 and may be omitted merely for clarity and ease of description. Some of the operations may be performed simultaneously, or in a different order than the ones shown in FIG. 3. Additional processes can be provided before, during, and/or after method 300, and that these additional processes can be briefly described herein. For illustrative purposes, the operations illustrated in FIG. 3 will be described with reference to the example fabrication process for fabricating vertically stacked semiconductor device 100 as illustrated in FIGS. 4-23. FIGS. 4-23 are partial cross-sectional views of vertically stacked semiconductor device 100 along line B-B of vertically stacked semiconductor device 100 at various stages of its fabrication, according to some embodiments. Although FIGS. 4-27 illustrate fabrication process of vertically stacked semiconductor device 100, method 300 can be applied to crossover-stacked semiconductor devices 200A and 200B, as well as other stacked semiconductor devices. Elements in FIGS. 4-23 with the same annotations as elements in FIGS. 1A and 1B are described above.

Figure 4:
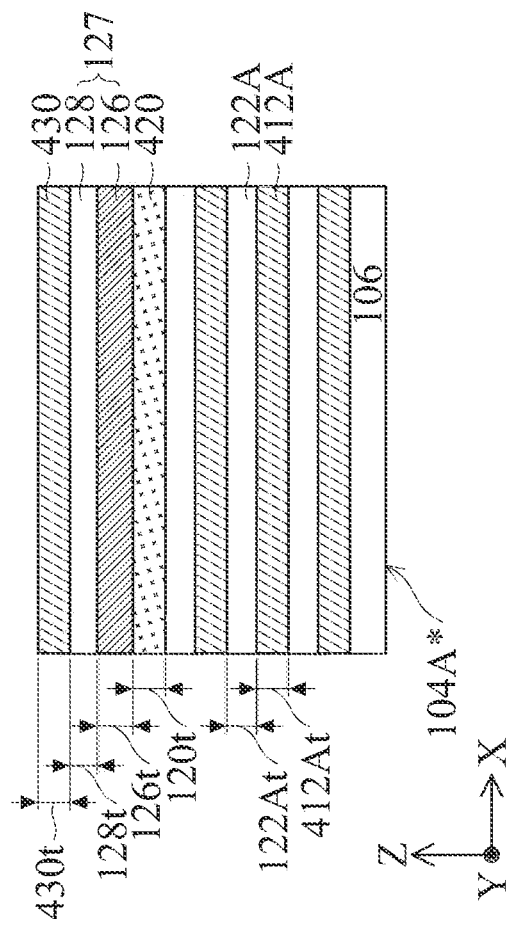

In referring to FIG. 3, method 300 begins with operation 310 and the process of forming a first fin structure. For example, as shown in FIG. 4, fin structure 104A* can be formed on substrate 106. Fin structure 104A* can include semiconductor layers 412A and 122A stacked in an alternating configuration. Each of semiconductor layers 412A and 122A can be epitaxially grown on its underlying layer and can include semiconductor materials different from each other. In some embodiments, semiconductor layers 412A and 122A can include semiconductor materials similar to or different from substrate 106. In some embodiments, semiconductor layers 412A and 122A can include semiconductor materials with oxidation rates and/or etch selectivity different from each other. In some embodiments, semiconductor layers 412A can include silicon germanium (SiGe) with Ge in a range from about 20 atomic percent to about 40 atomic percent with any remaining atomic percent being Si. In some embodiments, semiconductor layers 122A can include Si without any substantial amount of Ge.

Semiconductor layers 412A and/or 122A can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor, can be used. Semiconductor layers 412A and 122A can have respective thicknesses 412At and 122At along a Z-axis, each ranging from about 5 nm to about 12 nm and ranging from about 6 nm to about 10 nm respectively. Thicknesses 412At and 122At can be equal to or different from each other. Though three pairs of semiconductor layers 412A and 122A for fin structure 104A* are shown in FIG. 4, vertically stacked semiconductor device 100 can have any number of semiconductor layers 412A and 122A.

Referring to FIG. 3, in operation 320, a substrate layer is formed over the first fin structure. As shown in FIG. 4, another semiconductor layer 420, a doping layer 126, and another pair of semiconductor layers 128 and 430 can be formed on top of fin structure 104A*. Doping layer 126 and semiconductor layer 128 can be referred to as substrate layer 127 for subsequent growth of an epitaxial layer and a second fin structure. Each of doping layer 126 and semiconductor layers 420, 128, and 430 can also be epitaxially grown on its underlying layer and can include semiconductor materials different from each other. In some embodiments, doping layer 126 and semiconductor layers 420, 128, and 430 can be undoped or can be in-situ doped similar to semiconductor layers 412A and 122A.

In some embodiments, semiconductor layer 420 can include silicon germanium (SiGe) with Ge in a range from about 10 atomic percent to about 20 atomic percent with any remaining atomic percent being Si. In some embodiments, semiconductor layers 126 can include Si without any substantial amount of Ge and doped with a conductivity type different from substrate 106, For example, substrate 106 can be doped with n-type dopants, and doping layer 126 can be doped with p-type dopants.

In some embodiments, semiconductor layers 128 and 430 can be same as semiconductor layers 122A and 412A, respectively. In some embodiments, semiconductor layer 430 can serve as a capping layer to protect semiconductor layer 128. In some embodiments, semiconductor layer 128 can be used to epitaxially grow additional semiconductor layers. In some embodiments, semiconductor layer 430 can include silicon germanium (SiGe) with Ge in a range from about 20 atomic percent to about 40 atomic percent with any remaining atomic percent being Si. In some embodiments, semiconductor layer 128 can include Si without any substantial amount of Ge. In some embodiments, semiconductor layer 128 can have a thickness 128t along a Z-axis ranging from about 12 nm to about 20 nm. In some embodiments, semiconductor layer 430 can have a thickness 430t along a Z-axis ranging from about 10 nm to about 16 nm.

Referring to FIG. 3, in operation 330, an isolation structure can be formed between the first fin structure and the substrate layer. For example, FIGS. 5-14 show the formation of isolation structure 120 between fin structure 104A and doping layer 126. The formation of isolation structure 120 can include (i) vertical etch of semiconductor layers 122A, 412A, 128, 420, and 430 and doping layer 126, (ii) lateral etch of semiconductor layers 412A and 420, (iii) formation of inner spacer structures 116A, and (iv) filling of isolation structure 120.

Figure 5:
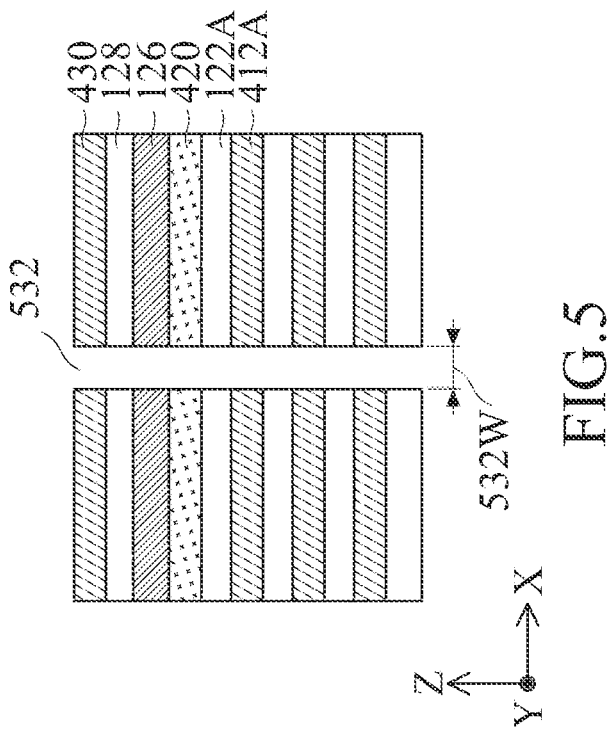

Referring to FIG. 5, semiconductor layers 122A, 412A, 128, 420, and 430 and doping layer 126 can be vertically etched to form an opening 532. In some embodiments, S/D regions can be formed in opening 532 in subsequent processes. In some embodiments, opening 532 can have a horizontal dimension 532w (e.g., width) along an X-axis direction ranging from about 12 nm to about 20 nm. In some embodiments, the vertical etch of the semiconductor layers 122A, 412A, 128, 420, and 430 and doping layer 126 can include a biased etching process. The biased etching process can be performed under a pressure in a range of about 1 mTorr to about 1000 mTorr, a power in range of about 50 W to about 1000 W, a bias voltage in a range of about 20 V to about 500 V, at a temperature in a range of about 40° C. to about 60° C., and using HBr and/or $Cl_2$ as etch gases. In some embodiments, the biased etching process can be directional and semiconductors layers 122A, 412A, 128, 420, and 430 and doping layer 126 can have substantially no lateral etch.

Figure 6:
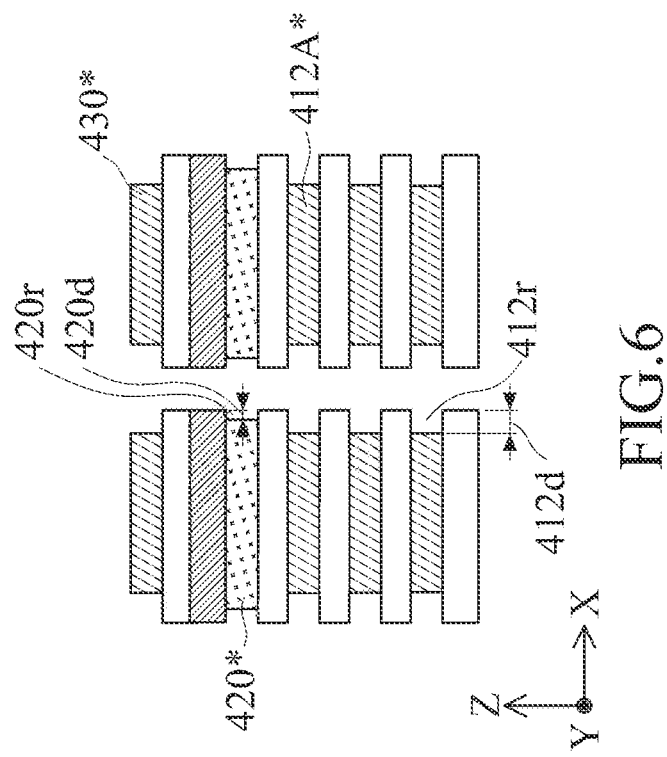

The vertical etch of semiconductors layers 122A, 412A, 128, 420, and 430 and doping layer 126 can be followed by a lateral etch of semiconductor layers 412A, 420, and 430, as shown in FIG. 6. The lateral etch can be performed by a dry etching process, a wet etching process, or a combination thereof. The etching process can include multiple cycles of etching and purging processes, such as about 3 to about 20 cycles of etching and purging processes. The etching process in each cycle can include using a gas mixture having hydrogen fluoride (HF) and a fluorine-based gas. The gas ratio of HF to the fluorine-based gas in the gas mixture can range from about 4 to about 30. The purging process in each cycle can include using a gas mixture having HF and nitrogen ($N_2$). HF in the purging process can remove by-products and/or clean the surface of etched portions for subsequent cycles. The purging process can be longer than the etching process in each cycle.

In some embodiments, semiconductor layers 412A* and 430* can have a higher etch rate than semiconductor layer 420*. In some embodiments, higher Ge concentration in semiconductor layers 412A* and 430* can lead to a higher etch rate than semiconductor layer 420*. In some embodiments, the Ge concentration in semiconductor layers 412A* and 430* can be at least 10 atomic percent higher than the Ge concentration in semiconductor layer 420*. In some embodiments, semiconductor layers 412A* can be laterally etched and form a lateral recess 412r having a horizontal dimension 412d (e.g., depth) along an X-axis ranging from about 8 nm to about 10 nm. In some embodiments, semiconductor layers 420* can be laterally etched and form a lateral recess 420r having a horizontal dimension 420d (e.g., depth) along an X-axis ranging from about 2 nm to about 3 nm.

Figure 7:
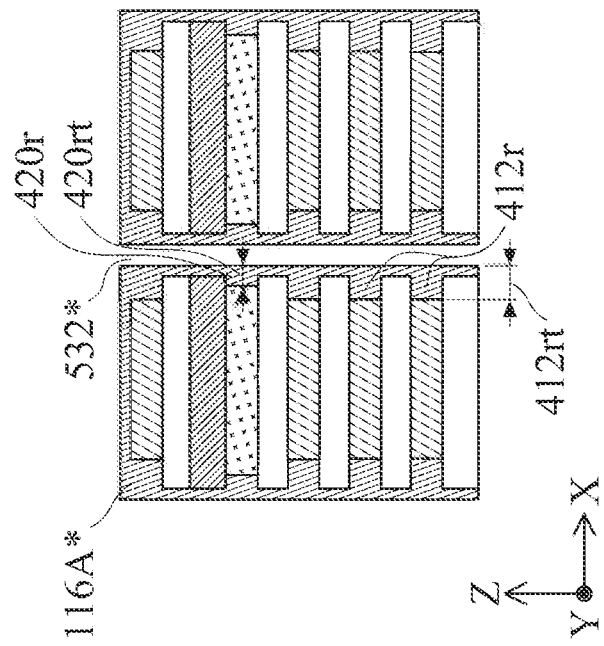
Figure 8:
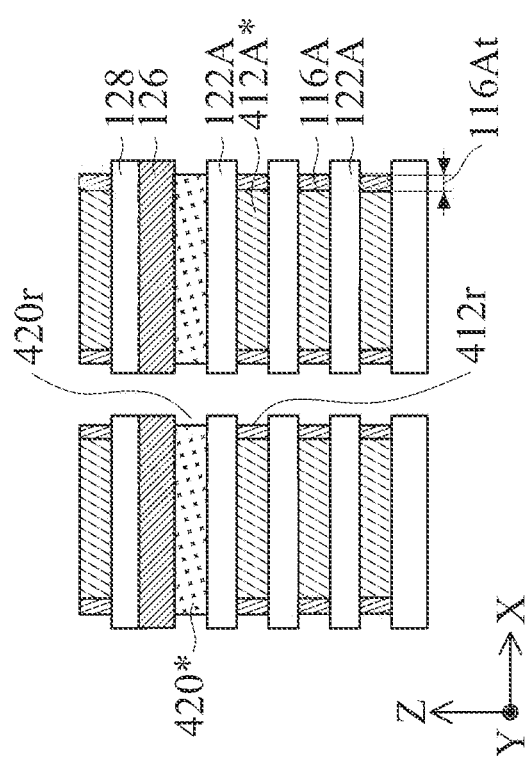

The lateral etch of semiconductor layers 412A, 420, and 430 can be followed by formation of inner spacer structures 116A, as shown in FIGS. 7-8. The formation of inner spacer structures 116A can further include (i) deposition of an inner spacer layer and (ii) lateral etch of the deposited inner spacer layer.

Referring to FIG. 7, inner spacer layer 116A* can be deposited on the structure of FIG. 6. In some embodiments, the deposition process can include multiple cycles of deposition and etch processes. In each cycle, the etch process can follow the deposition process to prevent the formation of voids within inner spacer layer 116A* by removing seams that can be formed within lateral recesses 420r and 412r. Inner spacer layer 116A* can include a single layer or a stack of dielectric layers, deposited by atomic layer deposition (ALD), flowable chemical vapor deposition (FCVD), or other suitable methods. Inner spacer layer 116A* can include dielectric material, such as SiOC, SiCN, SiOCN, SiN, silicon oxide ($SiO_x$), silicon oxynitride ($SiO_yN$), and a combination thereof. In some embodiments, after deposition, inner spacer layer 116A* in lateral recess 412r can have a horizontal dimension 412rt (e.g., thickness) along an X-axis ranging from about 10 nm to about 15 nm. In some embodiments, after deposition, inner spacer layer 116A* in lateral recess 420r can have a horizontal dimension 420rt (e.g., thickness) along an X-axis ranging from about 3 nm to about 5 nm.

The deposition of inner spacer layer 116A* can be followed by a lateral etch to form inner spacer structures 116A within lateral recess 412r, as shown in FIG. 8. In some embodiments, the lateral etch of inner spacer layer 116A* can include a dry etch process using a gas mixture of HF and nitrogen trifluoride ($NF_3$). After the lateral etch, inner spacer later 116At* can be removed from semiconductor layers 122A and 128 and doping layer 126. Lateral recess 420r can have substantially no inner spacer layer and lateral recess 412r can have inner spacer structures 116A with a thickness 116At ranging from about 5 nm to about 7 nm. Inner spacer structures 116A in lateral recess 412r can protect semiconductor layers 412A* from being etched in subsequent processes of isolation layer 120 formation.

The formation of inner spacer structures 116A can be followed by filling of isolation structure 120, as shown in FIGS. 9-14. The filling of isolation structure 120 can further include (i) removing semiconductor layer 420* to form an opening, (ii) fill the opening with an isolation layer, (iii) etching a portion of the isolation layer, (iv) formation of S/D epitaxial fin regions, and (v) forming another isolation layer on S/D epitaxial fin regions.

Figure 9:
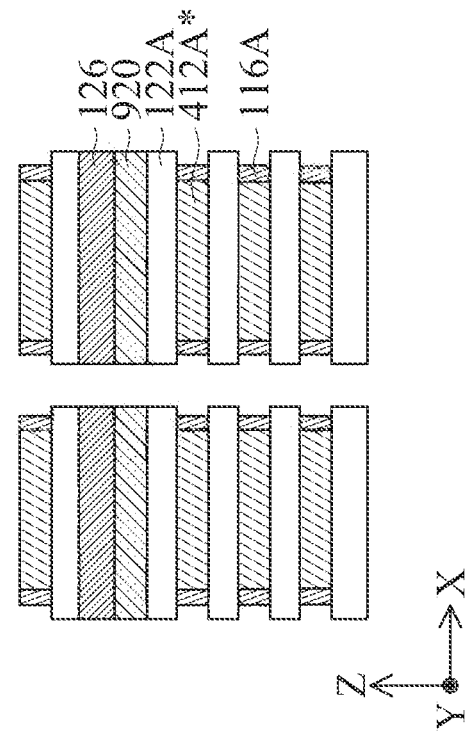

Referring to FIG. 9, semiconductor layer 420* can be removed to form an opening 920. In some embodiments, removal of semiconductor layer 420* can be performed by a dry etching process, a wet etching process, or a combination thereof. The etching process can include multiple cycles of etching and purging processes, such as about 3 to about 20 cycles of etching and purging processes. The etching process in each cycle can include using a gas mixture having ET and a fluorine-based gas. The gas ratio of the gas mixture of IMF to the fluorine-based gas can range from about 4 to about 30. The purging process in each cycle can include using a gas mixture having HF and nitrogen ($N_2$). HF in the purging process can remove by-products and/or clean the surface of etched portions for subsequent cycles. During removal of semiconductor layer 420*, semiconductor layers 412A* can be protected by inner spacer structures 116A. After removal of semiconductor layer 420*, opening 902 can be formed between semiconductor layer 122A and doping layer 126.

Figure 10:
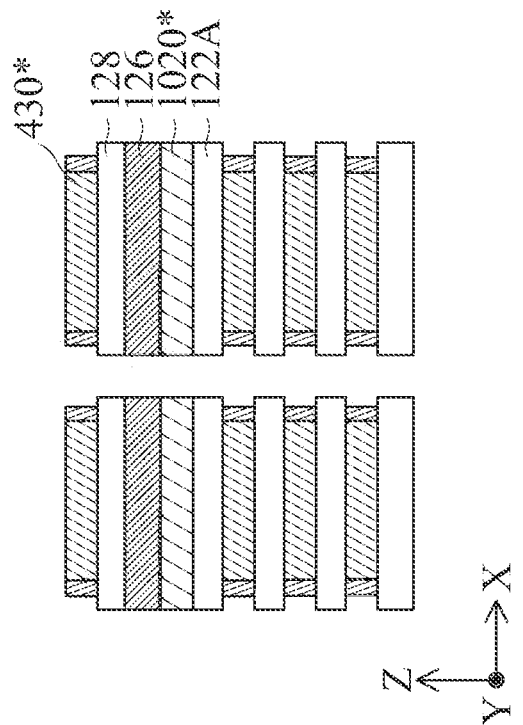

The removal of semiconductor layer 420* can be followed by fill opening 920 with an isolation layer 1020, as shown in FIG. 10. In some embodiments, isolation layer 1020 can be deposited on the structure of FIG. 9. In some embodiments, isolation layer 1020 can be deposited by ALD, CVD, or other suitable deposition methods to prevent formation of seams in isolation layer 1020 between semiconductor layer 122A and doping layer 126. In some embodiments, after the deposition, opening 920 can be filled with isolation layer 1020. In some embodiments, isolation layer 1020 can include insulation materials, such as silicon oxide, silicon nitride, a low-k material, other suitable insulating materials, and a combination thereof. Other deposition methods and insulating materials for isolation layer 1020 are within the scope and spirit of this disclosure.

Figure 11:
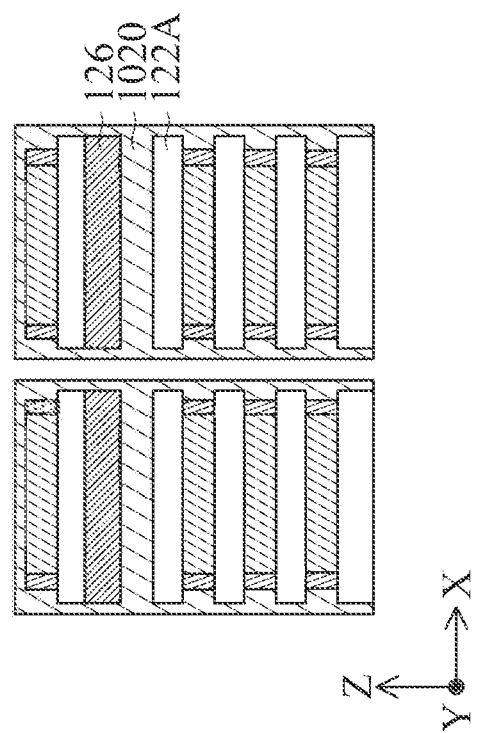

The filling of opening 920 with isolation layer 1020 can be followed by etching a portion of isolation layer 1020, as shown in FIG. 11. In some embodiments, the etching process can include a dry etch process using a gas mixture of HF and ammonia ($NH_3$). The gas ratio of HF to $NH_3$ can range from about 1 to about 20. In some embodiments, isolation layer 1020 can be etched off from semiconductor layers 122A, 128, and 430*, doping layer 126, and inner spacer structures 116A. In some embodiments, isolation layer 1020* between semiconductor layer 122A and doping layer 126 can be formed after the etching process.

Figure 12:
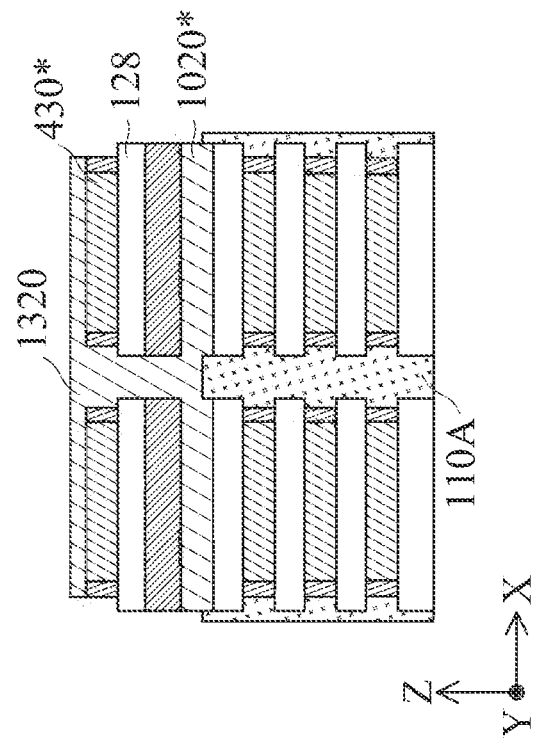

The etching of a portion of isolation layer 1020 can be followed by formation of epitaxial fin regions 110A, as shown in FIG. 12. In some embodiments, the formation of epitaxial fin regions 110A can include growth of epitaxial fin regions and etch of the epitaxial fin regions. In some embodiments, epitaxial fin regions can be grown on exposed surfaces of semiconductor layers 122A and 128 and doping layer 126. In some embodiments, the epitaxial fin regions grown on exposed surfaces can be etched to form epitaxial fin regions 110A. In some embodiments, the etch process can include dry etching and/or other directional etching methods. In some embodiments, the epitaxial fin regions can be etched below doping layer 126. In some embodiments, after the etch process, a vertical dimension 1020d (e.g., distance) along a Z-axis between the top surface of epitaxial fin regions 110A and the bottom of doping layer 126 can range from about 3 nm to about 5 nm. In some embodiments, vertical dimension 1020d can isolate epitaxial fin regions 110A of GAA finFET 102A from doping layer 126 and semiconductor layer 128 of GAA finFET 102B.

Figure 13:
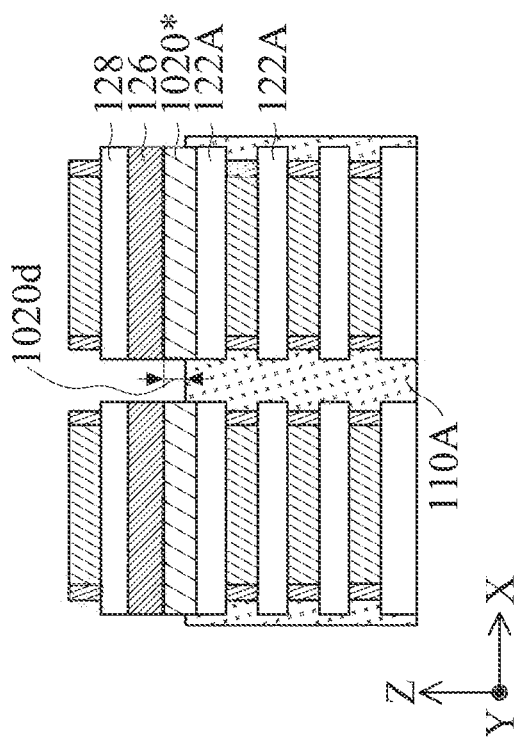
Figure 14:
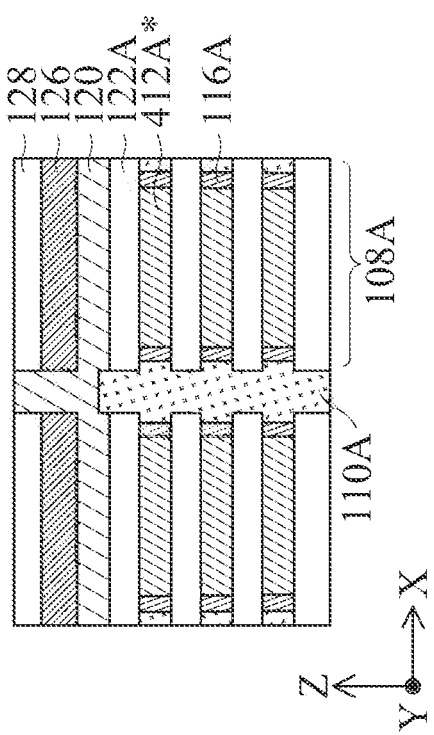

The formation of epitaxial fin regions 110A can be followed by forming another isolation layer on epitaxial fin regions 110A, as shown in FIGS. 13-14. Referring to FIG. 13, isolation layer 1320 can be deposited on the structure in FIG. 12. In some embodiments, isolation layer 1320 can be deposited by ALD, CVD, or other suitable methods. In some embodiments, isolation layer 1320 can include the same isolation materials as isolation layer 1020*. In some embodiments, isolation layer 1320 and semiconductor layer 430* can be polished and the polishing process can stop on semiconductor layer 128, as shown in FIG. 14. In some embodiments, the polishing process can include a chemical-mechanical polishing (CMP) process. In some embodiments, semiconductor layer 430* can be damaged during previous processes and thus polished away for subsequent semiconductor layer epitaxial growth on semiconductor layer 128. In some embodiments, semiconductor layer 430* can also be removed in subsequent processes of nanosheet/nanowire shaped semiconductor layer formation. In some embodiments, isolation structure 120 can be formed after the polishing process. In some embodiments, isolation structure 120 can include a first portion between semiconductor layer 122A and stacked fin portions 108A. In some embodiments, isolation structure 120 can include a second portion on epitaxial fin regions 110A.

Figure 15:
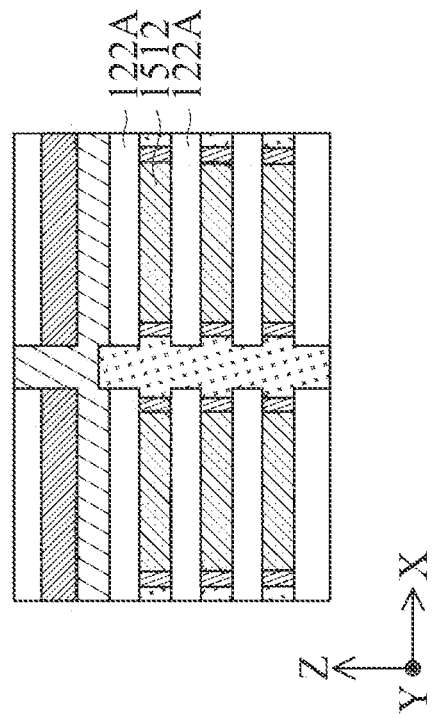

The formation of isolation structure 120 can be followed by metal gate formation, as shown in FIGS. 15 and 16. In some embodiments, metal gate formation can include nanosheet/nanowire shaped semiconductor layers 122A formation and metal gate fill. Referring to FIG. 15, semiconductor layers 412A* can be removed and form openings 1512 between semiconductor layers 122A, In some embodiments, semiconductor layers 412A* can be removed by an etching process using a gas mixture having HF and a fluorine-based gas. In some embodiments, the gas ratio of the HF to the fluorine-based gas in the gas mixture can range from about 60 to about 100.

The formation of nanosheet/nanowire shaped semiconductor layers 122A can be followed by a metal gate fill, as shown in FIG. 16. Prior to the metal gate fill, a gate dielectric layer can be formed on semiconductor layers 122A. In some embodiments, the gate dielectric layer can wrap around nanosheet/nanowire shaped semiconductor layers 122A and can include an interfacial layer (IL) and a high-k dielectric layer. Referring to FIG. 16, the metal gate can be filled in openings 1512 to form gate structures 112A. In some embodiments, gate structures 112A can also wrap around nanosheet/nanowire shaped semiconductor layers 122A and can include n-type or p-type work function metal.

Referring to FIG. 3, in operation 340, an epitaxial layer is formed in contact with the substrate layer and the isolation structure. For example, as shown in FIG. 17, epitaxial layer 130 can be formed in contact with substrate layer 127 and isolation structure 120. Substrate layer 127 can include semiconductor layer 128 and doping layer 126. In some embodiments, epitaxial layer 130 can be epitaxially grown similar to semiconductor layers 122A. In some embodiments, epitaxial layer 130 can include Si without any substantial amount of Ge. In some embodiments, epitaxial layer 130 can be epitaxially grown on semiconductor layer 128 and merge over the portion of isolation structure 120 on epitaxial fin regions 110A. In some embodiments, epitaxial layer 130 can have a thickness 130t along a Z-axis ranging from about 10 nm to about 20 nm.

Referring to FIG. 3, in operation 350, a second fin structure is formed over the first fin structure and in contact with the epitaxial layer. For example, as shown in FIG. 17, fin structure 104B* can be formed in contact with epitaxial layer 130. In some embodiments, isolation structure 120 can isolate fin structure 104B and fin structure 104A. In some embodiments, fin structure 104B* can have thickness 122Bt and spacing 122Bs along a Z-axis for semiconductor layers 122B* different from thickness 122At and spacing 122Bs for semiconductor layers 122A of fin structure 104A, respectively.

Stacked fin structures 104A and 104B* can provide independent control of semiconductor layer dimension and spacing for each fin structure. In some embodiments, the width and thickness of the semiconductor layers can be controlled to provide a balance between power consumption and performance. For example, semiconductor layers 122A can increase the width along a Y-axis (not shown) and thickness 122At to improve performance of GAA finfets 102A. Semiconductor layers 122B* can decrease the width along another Y-axis (not shown) and thickness 122Bt to reduce power and area consumption of GAA finfets 102B. In some embodiments, the thickness of and the spacing between the semiconductor layers can be controlled to balance conduction area and parasitic capacitance. In another example, semiconductor layers 122A can increase thickness 122At and spacing 122As to increase conduction area of GAA finfets 102A. Semiconductor layers 122B* can decrease thickness 122Bt and spacing 122Bs to reduce parasitic capacitance of GAA finfets 102B. In addition, semiconductor layers 122B* can have a different spacing from semiconductor layers 122A for a different conductivity type work function metal fill.

In some embodiments, fin structure 104B* can be vertically stacked on fin structure 104A and can extend along a same direction as fin structure 104A, as shown in FIG. 17. In some embodiments, fin structure 104B* can be crossover-stacked on fin structure 104A and can extend along a direction different from the direction of fin structure 104A. For example, fin structure 104B* can extend along a Y-axis and fin structure 104A can extend along an X-axis. According to some embodiments, compared with vertically stacked fin structures 104B* and 104A, crossover-stacked fin structures 104B* and 104A can provide more simplicity and compact in lithography and metal interconnect processes, which allow more flexible place and route for improved placement legalization and interconnect routing, in addition to independent control of semiconductor layer dimensions and spacings.

The formation of the second fin structure can be followed by a semiconductor layer lateral etch, inner spacer structure deposition and etch, epitaxial fin regions deposition and etch, formation of nanosheet/nanowire shaped semiconductor layer, and metal gate formation. FIG. 1B illustrates a cross-section view after metal gate formation of the second fin structure. In some embodiments, the semiconductor layer lateral etch, inner spacer structure deposition and etch, epitaxial fin regions deposition and etch, formation of nanosheet/nanowire shaped semiconductor layer, and metal gate formation of GAA finFET 102B can be similar to the processes to form GAA finFET 102A. With stacked GAA finFETs 102A and 102B, GAA finFETs 102B can have independent control of inner spacer structure 112B and gate structure 122B. In some embodiments, gate structure GAA finFET 102B can extend along a direction different from gate structure of GAA finFET 102A. For example, as shown in FIG. 2B, gate structure 212D can extend along an X-axis, and gate structure 212C can extend along a Y-axis. According to some embodiments, crossover-stacked semiconductor device with a rotated gate can provide further compact metal interconnect to reduce parasitic resistance and capacitance with shorter routing path, thus improving PPA performance. In some embodiments, compared with other planar GAA finFETs, crossover-stacked semiconductor device with a rotated gate can reduce the device area by about 30% to about 50%.

Referring to FIGS. 18-23, additional isolation structures can be formed between GAA finFETs 104A and 104B. As shown in FIG. 18, an epitaxial layer 1830 can be grown on the structure in FIG. 16 after metal gate formation. In some embodiments, epitaxial layer 1830 can include semiconductor material similar to semiconductor layer 128 and have a thickness 1830t along a Z-axis ranging from about 10 nm to about 30 nm. In some embodiments, epitaxial layer 1830 can cover semiconductor layer 128 and isolation structure 120 for subsequent semiconductor layer growth. A sacrificial fin structure 1837 including semiconductor layers 1838 and 1840 stacked in an alternating configuration can be formed on epitaxial layer 2246. In some embodiments, sacrificial fin structure 1837 can be formed similar to fin structure 104B* illustrated in FIG. 17, In some embodiments, semiconductor layers 1838 can include silicon germanium (SiGe) with Ge in a range from about 20 atomic percent to about 40 atomic percent with any remaining atomic percent being Si. In some embodiments, semiconductor layers 1840 can include Si without any substantial amount of Ge. In some embodiments, semiconductor layers 1838 and 1840 can be vertically etched, as shown in FIG. 5. In some embodiments, semiconductor layer 1838 can have a thickness 1838t along a Z-axis ranging from about 20 nm to about 25 nm. In some embodiments, semiconductor layer 1840 can have a thickness 1840t along a Z-axis ranging from about 3 nm to about 7 nm.

The formation of sacrificial fin structure 1837 can be followed by removal of semiconductor layers 1838, as shown in FIG. 19. The removal of semiconductor layers 1838 can be performed by an etching process similar as the formation of nanosheet/nanowire shaped semiconductor layer illustrated in FIG. 15.

Figure 21:
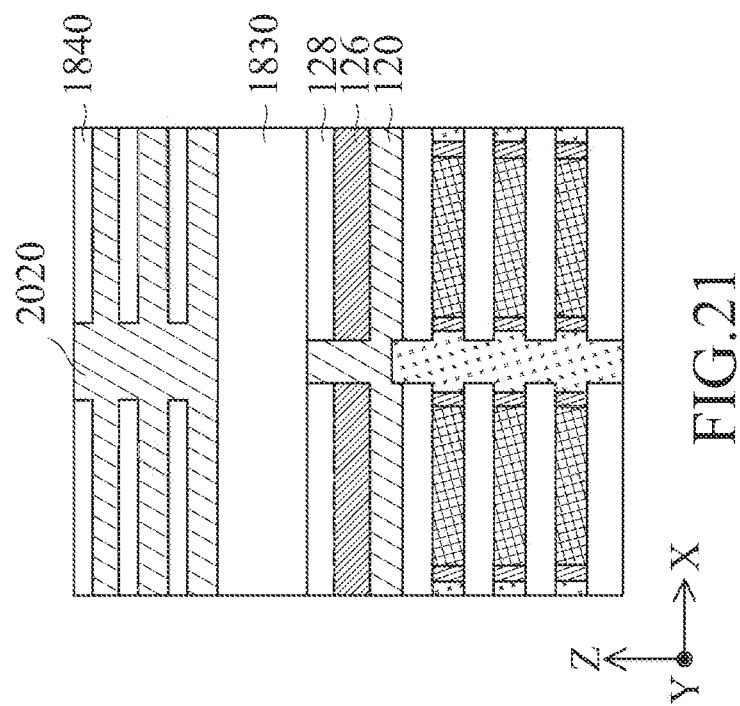
Figure 20:
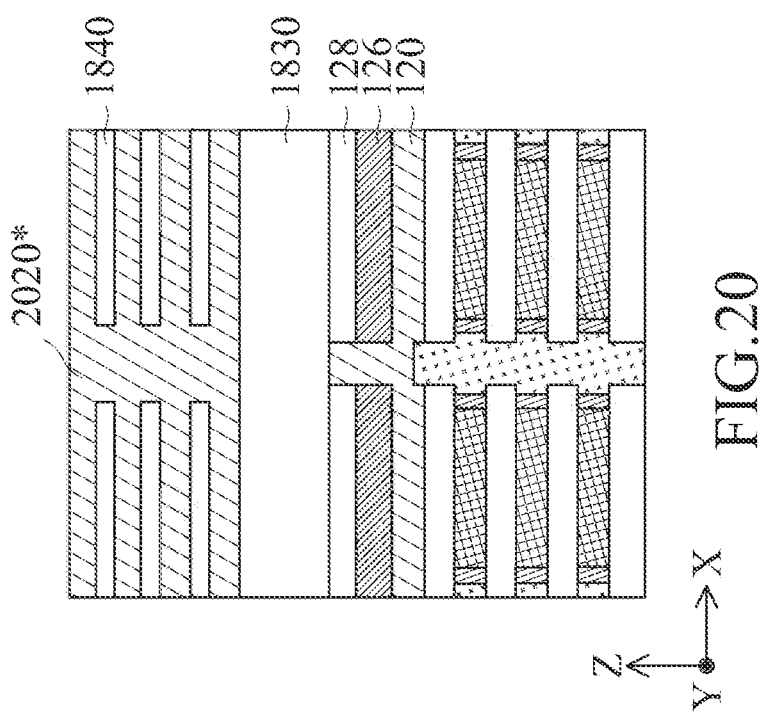

The removal of semiconductor layers 1838 can be followed by formation of isolation structure 2020, as shown in FIGS. 20 and 21. The formation of isolation structure 2020 can include deposition of isolation layer 2020* and CMP of isolation layer 2020*. Referring to FIG. 20, isolation layer 2020* can be deposited similar to isolation layer 1320 illustrated in FIG. 13. Referring to FIG. 21, isolation structure 2020 can be formed by a similar CMP process as isolation layer 120. According to some embodiments, isolation structures 120 and 2020 can improve isolation between top and bottom GAA finFETs.

Figure 23:
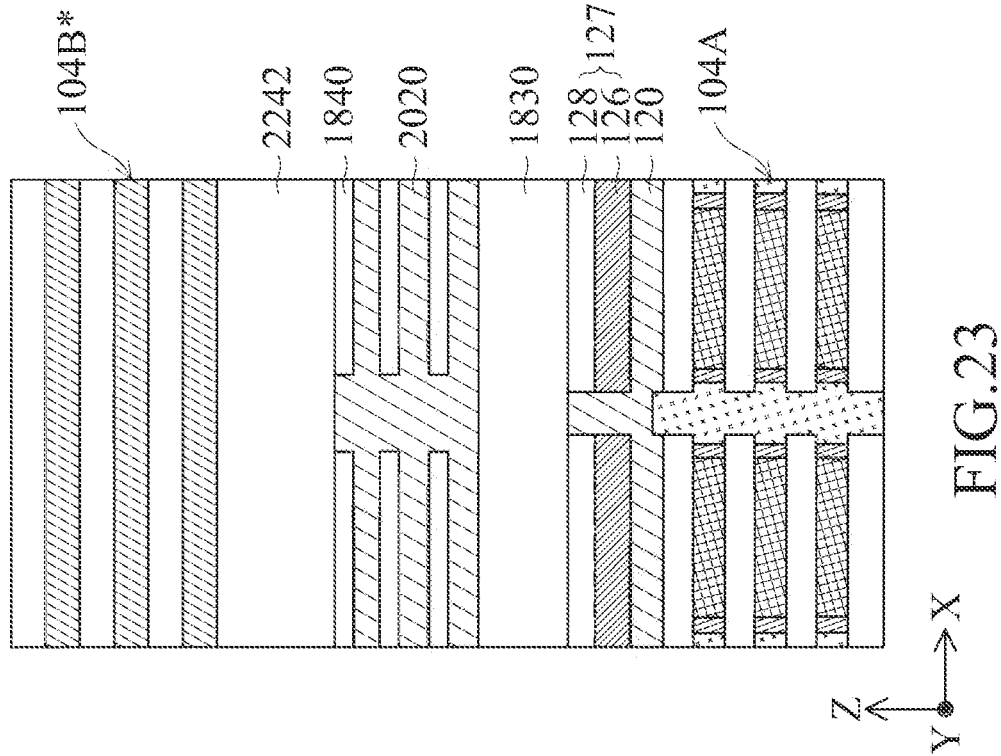
Figure 22:
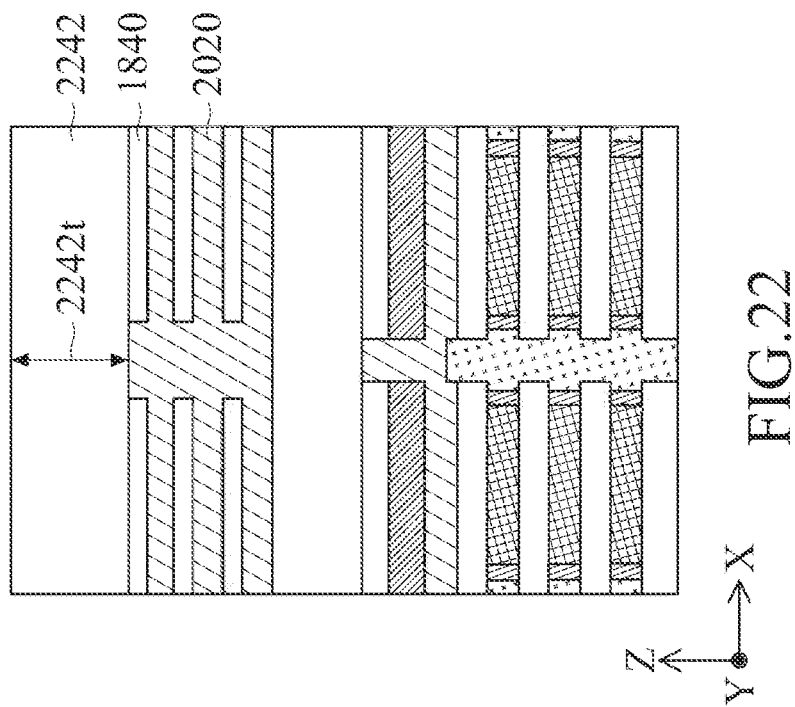

The formation of isolation structure 2020 can be followed by another epitaxial layer growth and formation of tin structure 104B*, as shown in FIGS. 22 and 23. Referring to FIG. 22, epitaxial layer 2242 can be grown on the structure in FIG. 21. In some embodiments, epitaxial layer 2242 can include semiconductor material similar to semiconductor layer 1840 and have a thickness 2242t along a Z-axis ranging from about 10 nm to about 30 nm. In some embodiments, epitaxial layer 2242 can cover semiconductor layer 1840 and isolation structure 2020 for subsequent semiconductor layer growth. In some embodiments, epitaxial layer 2242 can improve isolation between top and bottom GAA finFETs. Referring to FIG. 23, fin structure 104B* can be grown on epitaxial layer 2242. Subsequent processes can be performed on fin structure 104B* to form GAA finFET 102A.

Various embodiments in accordance with the present disclosure provide methods for forming a stacked semiconductor device, such as vertically stacked semiconductor device 100 and crossover-stacked semiconductor devices 200A and 200B. According to some embodiments, vertically stacked semiconductor device 100 can include a top fin structure 104B along an X-axis vertically stacked on top of a bottom fin structure 104A along another X-axis. In some embodiments, the vertically stacked fin structures 104A and 104B can each independently control their nanosheet/nanowire dimensions and spacings. In some embodiments, the top fin structure along a direction can be stacked on top of a bottom fin structure along another direction rotated by some degrees, such as about 90 degrees. In some embodiments, a crossover-stacked semiconductor device, such as 200A and 200B, can provide compact metal interconnect place and route tor the top and bottom fin structures, therefore improving PPA performance. In some embodiments, crossover-stacked semiconductor device 200B can include a top gate structure rotated by some degrees relative to the bottom gate structure, such as about 90 degrees. In some embodiments, crossover-stacked semiconductor device 200B with a rotated gate can provide further compact metal interconnect route and place to reduce parasitic resistance and capacitance, thus improving PPA performance. In some embodiments, isolation layer 120 can isolate fin structure 104B and fin structure 104A. In some embodiments, additional isolation structure 2020 can improve the isolation between fin structure 104B and fin structure 104B. In some embodiments, compared with other planar GAA finFETs, crossover-stacked semiconductor device 200B can reduce the device area by about 30% to about 50%.

In some embodiments, a semiconductor device includes a first fin structure, an isolation structure in contact with a top surface of the first fin structure, a substrate layer in contact with the isolation structure, an epitaxial layer in contact with the isolation structure and the substrate layer, and a second fin structure above the first fin structure and in contact with the epitaxial layer.

In some embodiments, a semiconductor device includes a first fin structure, a first isolation structure on a top surface of the first fin structure, a substrate layer on the first isolation structure, a first epitaxial layer on the first isolation structure and the substrate layer, a second isolation structure on the first epitaxial layer, a second epitaxial layer on the second isolation structure, and a second fin structure above the first fin structure and in contact with the second epitaxial layer.

In some embodiments, a method includes forming a first fin structure, forming a substrate layer over the first fin structure, forming an isolation structure between the substrate layer and the first fin structure, forming an epitaxial layer in contact with the isolation structure and the substrate layer, and forming a second fin structure above the first fin structure and in contact with the epitaxial layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the at will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming first and second sets of semiconductor layers on a substrate, wherein the first and second sets of semiconductor layers are stacked in an alternate configuration;
    forming an intermediate semiconductor layer on the first and second sets of semiconductor layers;
    forming a substrate layer on the intermediate semiconductor layer; and
    replacing the intermediate semiconductor layer with an isolation structure, wherein the isolation structure is between the substrate layer and the first and second sets of semiconductor layers.

2. The method of claim 1, wherein forming the first and second sets of semiconductor layers comprises:
    epitaxially growing silicon layers for the first set of semiconductor layers; and
    epitaxially growing silicon germanium layers for the second set of semiconductor layers.

3. The method of claim 2, wherein forming the intermediate semiconductor layer comprises epitaxially growing a silicon germanium layer having a germanium concentration less than a germanium concentration of the second set of semiconductor layers.

4. The method of claim 1, wherein replacing the intermediate semiconductor layer with the isolation structure comprises:
    removing the intermediate semiconductor layer to form an opening between the substrate layer and the first and second sets of semiconductor layers; and
    filling the opening with a layer of insulating material.

5. The method of claim 4, wherein filling the opening with the layer of insulating material comprises:
    depositing the layer of insulating material on the substrate layer and the first and second sets of semiconductor layers to fill the opening between the substrate layer and the first and second sets of semiconductor layers; and
    removing the layer of insulating material from side surfaces of the substrate layer and the first and second sets of semiconductor layers.

6. The method of claim 1, wherein forming the substrate layer comprises:
    forming a doped silicon layer on the intermediate semiconductor layer; and
    forming an un-doped silicon layer on the doped silicon layer.

7. The method of claim 1, further comprising forming a capping semiconductor layer on the substrate layer, wherein the capping semiconductor layer and the second set of semiconductor layers comprise silicon germanium.

8. The method of claim 1, further comprising replacing the second set of semiconductor layers with a gate structure, wherein the gate structure wraps around the first set of semiconductor layers.

9. The method of claim 1, further comprising:
    forming an epitaxial layer on the substrate layer and the isolation structure; and
    forming a third set of semiconductor layers on the epitaxial layer, wherein the isolation structure isolates the first set of semiconductor layers from the substrate layer, the epitaxial layer, and the third set of semiconductor layers.

10. A method, comprising:
forming a stack of semiconductor layers on a substrate, wherein the stack of semiconductor layers comprises:
first and second sets of semiconductor layers stacked in an alternate configuration;
an intermediate semiconductor layer on the first and second sets of semiconductor layers;
a substrate layer on the intermediate semiconductor layer; and
a capping semiconductor layer on the substrate layer;
forming an opening in the stack of semiconductor layers, wherein the opening separates the stack of semiconductor layers into more than one stacks of semiconductor layers;
forming inner spacers structures on opposite ends of the second set of semiconductor layers and opposite ends of the capping semiconductor layer;
replacing the intermediate semiconductor layer with an isolation structure; and
filling the opening with source/drain (S/D) regions.

11. The method of claim 10, wherein forming the stack of semiconductor layers comprises:
epitaxially growing silicon layers for the first set of semiconductor layers;
epitaxially growing silicon germanium layers for the second set of semiconductor layers;
epitaxially growing a silicon germanium layer for the intermediate semiconductor layer, wherein a germanium concentration in the intermediate semiconductor layer is less than a germanium concentration in the second set of semiconductor layers;
epitaxially growing a doped silicon layer and an up-doped silicon layer for the substrate layer; and
epitaxially growing a silicon germanium layer for the capping semiconductor layer.

12. The method of claim 10, wherein the replacing the intermediate semiconductor layer with the isolation structure comprises:
removing the intermediate semiconductor layer to form an additional opening between the substrate layer and the first and second sets of semiconductor layers; and
filling the additional opening with a layer of insulating material.

13. The method of claim 10, Wherein filling the opening with S/D regions comprises:
epitaxially growing the S/D regions on exposed surfaces of the first set of semiconductor layers and the substrate layer; and
removing a portion of the epitaxially grown S/D regions, wherein a top surface of the S/D regions is below a bottom surface of the substrate layer.

14. The method of claim 10, further comprising forming an additional isolation structure in the opening, wherein the additional isolation structure is in contact with the isolation structure.

15. The method of claim 10, further comprising:
forming an epitaxial layer on the substrate layer and the isolation structure; and
forming a third set of semiconductor layers on the epitaxial layer, wherein the isolation structure isolates the first set of semiconductor layers from the substrate layer, the epitaxial layer, and the third set of semiconductor layers.

16. A method, comprising:
forming a first stack of semiconductor layers on a substrate, wherein the first stack of semiconductor layers comprises:
first and second sets of semiconductor layers stacked in an alternate configuration;
an intermediate semiconductor layer on the first and second sets of semiconductor layers;
a substrate layer on the intermediate semiconductor; and
a capping semiconductor layer on the substrate layer;
replacing the intermediate semiconductor layer with a first isolation structure;
forming a first epitaxial layer on the first isolation structure and the first stack of semiconductor layers;
forming a second isolation structure on the first epitaxial layer;
forming a second epitaxial layer on the second isolation structure; and
forming a second stack of semiconductor layers on the second epitaxial layer.

17. The method of claim 16, wherein forming the second isolation structure comprises:
forming a third stack of semiconductor layers on the first epitaxial layer, wherein the third stack of semiconductor layers comprises third and fourth sets of semiconductor layers stacked in the alternate configuration; and
replacing the fourth set of semiconductor layers with the second isolation structure.

18. The method of claim 16, wherein forming the first stack of semiconductor layers comprises:
epitaxially growing silicon layers for the first set of semiconductor layers;
epitaxially growing silicon germanium layers for the second set of semiconductor layers;
epitaxially growing a layer of silicon germanium for the intermediate semiconductor layer, wherein a germanium concentration in the intermediate semiconductor layer is less than a germanium concentration in the second set of semiconductor layers;
epitaxially growing a doped silicon layer and an up-doped silicon layer for the substrate layer; and
epitaxially growing a silicon germanium layer for the capping semiconductor layer.

19. The method of claim 16, wherein the replacing the intermediate semiconductor layer with the isolation structure comprises:
removing the intermediate semiconductor layer to form an opening between the substrate layer and the first and second sets of semiconductor layers; and
filling the opening with a layer of insulating material.

20. The method of claim 16, further comprising forming S/D regions in contact with the first set of semiconductor layers and the first isolation structure.

* * * * *